United States Patent
Suzuki et al.

(10) Patent No.: US 8,334,214 B2
(45) Date of Patent: Dec. 18, 2012

(54) SUSCEPTOR TREATMENT METHOD AND A METHOD FOR TREATING A SEMICONDUCTOR MANUFACTURING APPARATUS

(75) Inventors: Kunihiko Suzuki, Shizuoka (JP);
Shinichi Mitani, Shizuoka (JP)

(73) Assignees: NuFlare Technology, Inc., Shizuoka (JP); Denso Corporation, Aichi (JP)

( * ) Notice: Subject to any disclaimer, the term of this patent is extended or adjusted under 35 U.S.C. 154(b) by 0 days.

(21) Appl. No.: 13/170,867

(22) Filed: Jun. 28, 2011

(65) Prior Publication Data
US 2012/0028445 A1 Feb. 2, 2012

(30) Foreign Application Priority Data
Jul. 30, 2010 (JP) ................................. 2010-172962

(51) Int. Cl.
*H01L 21/302* (2006.01)
(52) U.S. Cl. .................. 438/706; 438/905; 257/E21.092
(58) Field of Classification Search ........... 257/E21.092, 257/E21.097, E21.483, E21.532
See application file for complete search history.

(56) References Cited

U.S. PATENT DOCUMENTS
2006/0065634 A1* 3/2006 Van Den Berg ................ 216/89

FOREIGN PATENT DOCUMENTS
JP 2007-73628 3/2007
JP 2008-108983 5/2008

OTHER PUBLICATIONS
Miura et al., "Determination of Etch Rate Behavior of 4H-SiC Using Chlorine Trifluoride Gas," Japanese Journal of Applied Physics (2007), 46:7875-79.

* cited by examiner

*Primary Examiner* — Cheung Lee
(74) *Attorney, Agent, or Firm* — Finnegan, Henderson, Farabow, Garrett & Dunner, L.L.P.

(57) ABSTRACT

A susceptor treatment method including placing a first substrate on a susceptor and forming a Si film on the first substrate by epitaxial growth, placing a second substrate on the susceptor in place of the first substrate and forming a SiC film on the second substrate by epitaxial growth, and allowing HCl gas to flow downward from above the susceptor while the susceptor, from which the second substrate has been removed, is heated to a temperature and rotated to remove the remaining crystalline grains derived from the epitaxial growth of Si film and the SiC film on the susceptor.

18 Claims, 2 Drawing Sheets

SUSCEPTOR TREATMENT METHOD AND A METHOD FOR TREATING A SEMICONDUCTOR MANUFACTURING APPARATUS

CROSS-REFERENCE TO THE RELATED APPLICATION

The entire disclosure of the Japanese Patent Application No. 2010-172962, filed on Jul. 30, 2010 including specification, claims, drawings, and summary, on which the Convention priority of the present application is based, are incorporated herein in its entirety.

FIELD OF THE INVENTION

Background

The present invention relates to a susceptor treatment method and a method for treating a semiconductor manufacturing apparatus.

Epitaxial growth technique is conventionally used to produce a semiconductor device such as a power device (e.g., IGBT (Insulated Gate Bipolar Transistor)) requiring a relatively-thick crystalline film.

In the case of vapor phase epitaxy used in epitaxial growth technique, a wafer is placed inside a film-forming chamber maintained at atmospheric pressure or a reduced pressure, and a reaction gas is supplied into the film-forming chamber while the wafer is heated. As a result, a pyrolytic reaction or a hydrogen reduction reaction of the reaction gas occurs on the surface of the wafer so that an epitaxial film is formed on the wafer.

In order to produce a thick epitaxial film in high yield, a fresh reaction gas needs to be continuously brought into contact with the surface of a uniformly-heated wafer to increase a film-forming rate. Therefore, in the case of a conventional film-forming apparatus, a film is epitaxially grown on a wafer while the wafer is rotated at a high speed (see, for example, Japanese Patent Application Laid-Open No. 2008-108983).

When film formation is performed by vapor phase epitaxy in a film-forming chamber, a film derived from a reaction gas is deposited not only on the surface of a wafer but also on a susceptor that supports the wafer, the inner wall of the film-forming chamber, and pipes used for discharging gas from the film-forming chamber. If the film comes off, dust is generated, resulting in a defective epitaxial film being formed on a wafer. For this reason, the deposited film needs to be removed.

Japanese Patent Application Laid-open No. 2007-73628 discloses an apparatus including an etching chamber, in which a film deposited on a susceptor during formation of a Si (silicon) epitaxial film is removed.

In recent years, attention has been given to SiC (silicon carbide) epitaxial growth technique. SiC is characterized in that its energy gap is two or three times larger and its dielectric breakdown field is about one digit larger than that of a conventional semiconductor material such as Si (silicon) or GaAs (gallium arsenide). For this reason, SiC is a semiconductor material expected to be used in high-voltage power semiconductor devices.

However, unlike Si film formation, a film deposited on a susceptor, as one example, during SiC film formation cannot be removed by etching using HCl gas. The deposited film can be removed using $ClF_3$ gas, but there is a problem with $ClF_3$ gas in that it is difficult to handle because of the danger of an explosion caused by mixing with $H_2$ gas. Further, as the susceptor may have a surface coating of isotropic graphite with a SiC film by CVD (Chemical Vapor Deposition), there is a fear that the SiC film of the susceptor will also be etched using $ClF_3$ gas.

In view of the above problems, it is an object of the present invention to provide a susceptor treatment method and a semiconductor manufacturing apparatus treatment method which makes it possible to remove a film deposited on a susceptor during SiC epitaxial growth.

Other challenges and advantages of the present invention are apparent from the following description.

SUMMARY OF THE INVENTION

In one aspect of the present invention, a susceptor treatment method comprising the steps of: placing a first substrate on a susceptor and forming a Si film on the first substrate by epitaxial growth; placing a second substrate on the susceptor in place of the first substrate and forming a SiC film on the second substrate by epitaxial growth; allowing HCl gas to flow downward from above the susceptor while the susceptor from which the second substrate has been removed is heated to remove the Si film and the SiC film on the susceptor.

In another aspect of the present invention, a method for treating a semiconductor manufacturing apparatus comprising a susceptor on which a wafer is to be placed and a film-forming chamber in which the susceptor is placed to form an epitaxial film on the wafer, comprising the steps of: placing a dummy wafer on the susceptor in the film-forming chamber and forming a Si film on the dummy wafer by epitaxial growth; placing the wafer on the susceptor in place of the dummy wafer and forming a SiC film on the wafer by epitaxial growth; removing the wafer from the susceptor; and allowing HCl gas to flow downward from above the susceptor while the susceptor is heated to remove the Si film and the SiC film on the susceptor.

DETAILED DESCRIPTION OF EMBODIMENT

Figure 1:
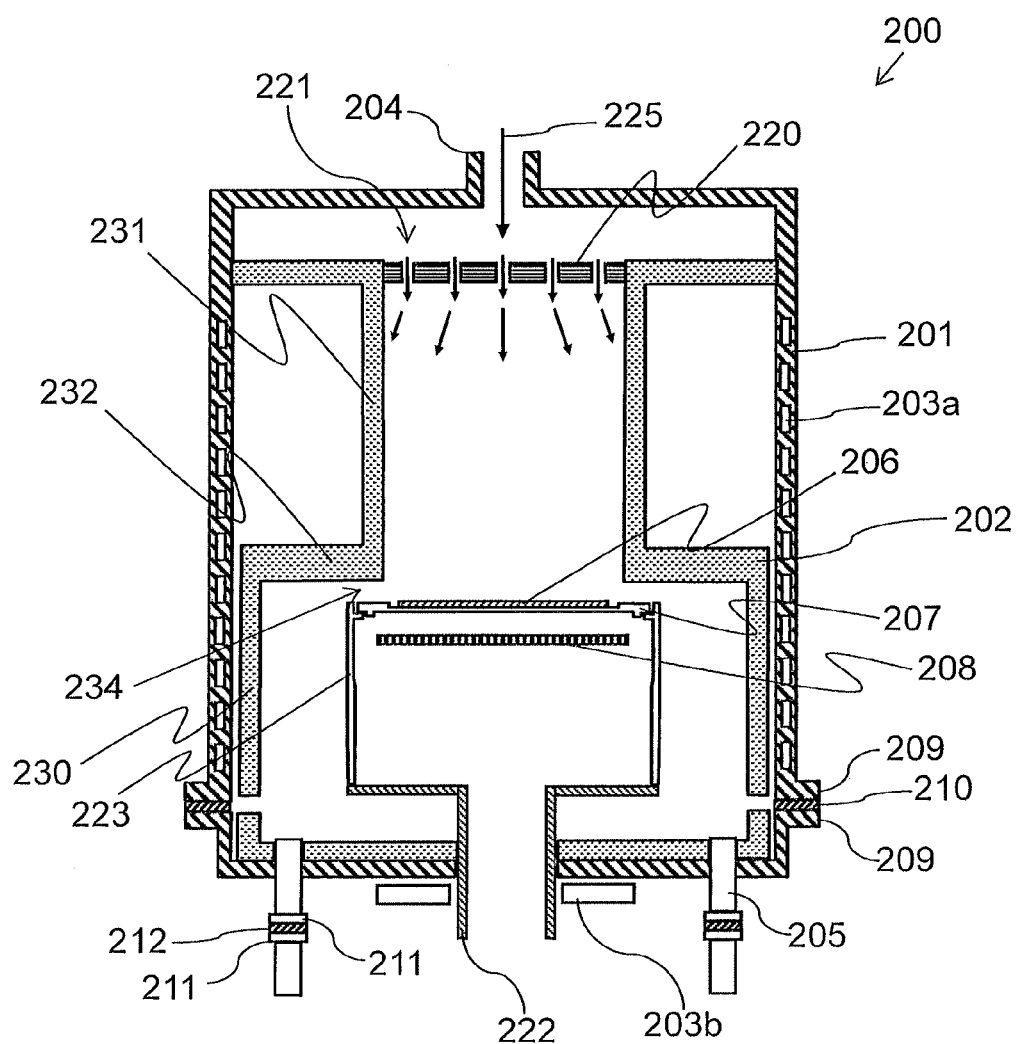
FIG. 1 is a schematic sectional view of a semiconductor manufacturing apparatus according to the present invention.

FIG. 1 is a schematic sectional view of a semiconductor manufacturing apparatus according to one embodiment of the present invention.

In FIG. 1 a semiconductor manufacturing apparatus 200, reference numeral 201 denotes a film-forming chamber, reference numeral 202 denotes a hollow cylindrical liner that covers and protects a chamber inner wall, reference numerals 203a and 203b denote flow channels of cooling water for cooling the chamber, reference numeral 204 denotes a supply portion that introduces a process gas 225, reference numeral 205 denotes a discharge portion that discharges the process gas after reaction, reference numeral 206 denotes a substrate, such as a wafer, to be subjected to vapor phase epitaxy, reference numeral 207 denotes a susceptor that supports the substrate 206, reference numeral 208 denotes a heater that is supported by a supporting portion (not shown) for heating the substrate 206, reference numeral 209 denotes a flange portion that connects upper and lower parts of the chamber 201 to each other, reference numeral 210 denotes a gasket that seals the flange portion 209, reference numeral 211 denotes a flange portion that connects the discharge portion 205 with a pipe, and reference numeral 212 denotes a gasket that seals the flange portion 211.

As the heater 208, a heater for resistance heating made of a SiC material is used. It is to be noted that the shape of the heater 208 is not limited to a structure shown in FIG. 1 and that heating may be performed by using two types of heaters, an in-heater and an out-heater.

The liner 202 is usually made of quartz and is transparent. The liner 202 includes a head part 231 having an upper opening into which a shower plate 220 is fitted to act as a gas straightening vane to uniformly supply the process gas 225 to the surface of the substrate 206.

At the bottom of the chamber 201, a rotating shaft 222 that extends to the inside of the chamber 201 is provided. At the upper end of the rotating shaft 222, a rotating cylinder 223 is provided, and the susceptor 207 is attached to the rotating cylinder 223. This allows the susceptor 207 to be disposed above the heater 208 and inside the chamber 201. Such a rotation mechanism makes it possible to form an epitaxial film on the substrate 206 while rotating the substrate 206 at a high speed. This method can improve a film-forming rate because a fresh process gas continuously comes into contact with the surface of the uniformly-heated substrate 206.

In the apparatus 200 shown in FIG. 1, through holes 221 of the shower plate 220 are arranged within a region corresponding to the substrate 206. This makes it possible to uniformly supply the process gas 225 supplied from the supply portion 204 onto the substrate 206 placed on the susceptor 207.

The liner 202 having a hollow cylindrical shape is configured so that the head part 231 that supports the shower plate 220 has an inner diameter smaller than that of a body part 230 in which the susceptor 207 is placed. More specifically, the head part 231 of the hollow cylindrical liner 202 that supports the shower plate 220 on the upper side and serves as a flow channel of the process gas 225 that has passed through the shower plate 220 has an inner diameter smaller than that of the body part 230 of the liner 202 in which the substrate 206 is placed. That is, the liner 202 has such a structure that the cross-sectional area of the head part 231 is smaller than that of the body part 230.

Such a structure makes it possible to reduce wasted space where the process gas 225 that has passed through the through holes 221 of the shower plate 220 is diffused. This makes it possible to focus the process gas 225 supplied through the shower plate 220 on the surface of the substrate 206 without wasting the process gas 225.

The process gas 225 supplied from the supply portion 204 into the chamber 201 flows downward through the head part 231 toward the surface of the substrate 206. At this time, in order to allow the process gas 225 to flow more uniformly onto the surface of the substrate 206, the gap between the periphery of the substrate 206 and the liner 202 is made narrow. More specifically, the gap between the periphery of the substrate 206 and an edge 234 of a stepped portion 232 located at the boundary between the head part 231 and the body part 230 of the liner 202 is made narrow.

In the semiconductor manufacturing apparatus 200, the substrate 206 is supported by the susceptor 207 in the chamber 201. The substrate 206 is heated by the heater 208 to a temperature of 1000° C. or higher while being rotated by rotating the susceptor 207 by means of the rotating shaft 222. In this state, the process gas 225 containing a reaction gas is supplied from the supply portion 204 through the through holes 221 of the shower plate 220 into the chamber 201.

As a result, a pyrolytic reaction or a hydrogen reduction reaction occurs on the surface of the substrate 206 so that an epitaxial film is formed on the surface of the substrate 206. At this time, the process gas other than that used for a vapor-phase growth reaction is turned into a denatured production gas and is discharged together with the process gas 225 through the discharge portion 205 provided in the lower part of the chamber 201.

According to this embodiment, a SiC epitaxial film is formed on the substrate 206 in the chamber 201. More specifically, the substrate 206 is placed on the susceptor 207, and is heated while being rotated by rotating the susceptor 207. In this state, a reaction gas is brought into contact with the surface of the substrate 206 to form a SiC epitaxial film on the surface of the substrate 206.

As the substrate 206, for example, a SiC wafer or a Si wafer can be used. Alternatively, another insulating substrate such as a $SiO_2$ (quartz) wafer or a high-resistance semi-insulating substrate such as a GaAs (gallium arsenide) wafer may be used.

In order to achieve epitaxial growth of SiC, it is necessary to increase the temperature of the substrate 206 to 1500° C. or higher. Therefore, the susceptor 207 needs to be made of a high heat-resistance material. More specifically, a susceptor 207, obtained by coating the surface of isotropic graphite with SiC by CVD (Chemical Vapor Deposition), is used. The shape of the susceptor 207 is not particularly limited as long as the substrate 206 can be placed on the susceptor 207, and may be appropriately selected. Examples thereof include a ring shape and a disk shape.

As the reaction gas, a mixture gas obtained by mixing, for example, a silicon (Si) source gas such as silane ($SiH_4$) or dichlorosilane ($SiH_2Cl_2$), a carbon source gas such as propane ($C_3H_8$) or acetylene ($C_2H_2$), and hydrogen ($H_2$) gas as a carrier gas is used.

It is to be noted that, in addition to the supply portion 204, a hydrogen gas supply portion for supplying hydrogen gas as a carrier gas into the chamber 201 may be further provided in the upper part of the chamber 201. In this case, a gas containing a carbon (c) source gas such as acetylene is supplied from the supply portion 204 and hydrogen gas as a carrier gas is supplied from the hydrogen gas supply portion so that the gases are mixed in the chamber 201 and supplied onto the surface of the substrate 206.

As described above, in the process of SiC epitaxial growth, it is necessary to increase the temperature of the substrate 206 to a very high level. However, when the substrate 206 is heated by the heater 208 to increase the temperature thereof, radiant heat from the heater 208 is transferred not only to the substrate 206 but also to other members constituting the chamber 201 so that the temperatures thereof are also increased. This phenomenon particularly occurs in members located near portions to be heated to high temperature, such as the substrate 206 and the heater 208, the inner wall of the chamber 201, and pipes used to discharge gas. When the reaction gas comes into contact with high-temperature portions in the chamber 201, a pyrolytic reaction of the reaction gas occurs as in the case where the reaction gas comes into contact with the surface of the substrate 206.

For example, in order to form a SiC epitaxial film on the surface of the substrate 206, a mixture gas prepared by mixing silane ($SiH_4$) as a Si source, propane ($C_3H_8$) as a C source, and hydrogen gas as a carrier gas is used as a reaction gas. The reaction gas is supplied through the supply portion 204 provided in the upper part of the chamber 201 into the chamber 201, and decomposes when reaching the surface of the substrate 206.

However, the reaction gas having such a composition as described above is highly reactive, and therefore when the reaction gas comes into contact with a member that is at a certain temperature, a decomposition reaction also occurs on such a member other than the surface of the substrate 206. As a result, a polycrystalline SiC film derived from the reaction gas is deposited on members inside the chamber 201, more specifically, on the susceptor 207, the inner wall of the chamber 201, and pipes used for discharging gas in the chamber 201. If the film comes off, dust is generated so that a defective epitaxial film is formed on the substrate 206. For this reason, it is necessary to remove the deposited film by cleaning. It can be considered that the deposited film is a nondense and polycrystalline SiC film that is different from a dense and polycrystalline SiC film constituting the susceptor 207 and the inner wall of the chamber 201. Here, the phrase "dense and polycrystalline" means that the SiC film is polycrystalline but closer to a single crystal film.

According to this embodiment, a SiC film deposited on the susceptor 207 is removed in the following manner.

FIGS. 2a to 2h are diagrams for explaining the susceptor treatment method according to this embodiment.

Figure 2A:
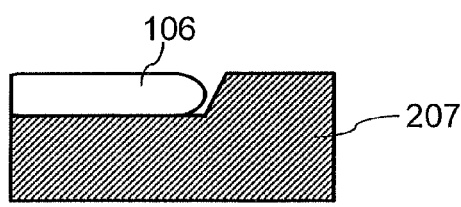
FIG. 2a shows a substrate placed on a susceptor.

In order to form a SiC film, first, the substrate (wafer) 206 is transported into the chamber 201 and placed on the susceptor 207. Here, according to this embodiment, another substrate (dummy wafer) 106 is transported into the chamber 201 before the transport of the substrate 206 into the chamber 201, and as shown in FIG. 2a, the substrate 106 is placed on the susceptor 207. The substrate 106 and the substrate 206 may be of the same type or of different types.

Then, a Si film 301 is formed on the substrate 106. The thickness of the Si film 301 is preferably in the range of 20 to 50 μm. An Si film 301 that is too thick is not suitable from the viewpoint of cost because the Si film 301 is removed in a subsequent step. On the other hand, if the Si film 301 is too thin, the Si film 301 cannot exhibit film properties and therefore the effect of the present invention (which will be described below) cannot be obtained.

For example, a silicon wafer is used as the substrate 106. The silicon wafer is placed on the susceptor 207. Then, the silicon wafer is rotated at about 50 rpm by rotating the susceptor 207 while hydrogen gas is allowed to flow under atmospheric pressure or an appropriate reduced pressure. Then, the silicon wafer is heated to a temperature between 1100 and 1200° C. by the heater 208. After it is confirmed that the temperature of the silicon wafer has reached 1150° C. by measurement using a radiation thermometer (not shown), the number of revolutions of the silicon wafer is gradually increased. Then, a raw material gas is supplied from the supply portion 204 through the shower plate 202 into the chamber 201. As the raw material gas, trichrolosilane can be used, and a mixture gas of the raw material gas and hydrogen gas as a carrier gas is introduced from the supply portion 204 into the chamber 201. The raw material gas introduced into the chamber 201 flows downward toward the silicon wafer. Then, the susceptor 207 is rotated at a high speed of 900 rpm or more while the temperature of the silicon wafer is kept at 1150° C., and a fresh raw material gas is continuously supplied from the supply portion 204 through the shower plate 202 onto the silicon wafer. This makes it possible to form a silicon epitaxial film having a uniform thickness on the silicon wafer.

Figure 2B:
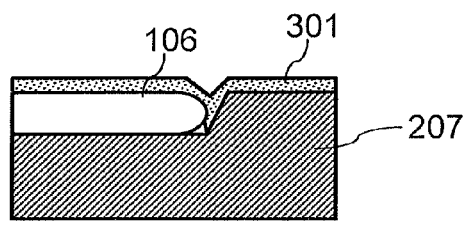
FIG. 2b shows a Si film formed on the susceptor.

In the step of forming a Si film on the substrate 106, as shown in FIG. 2b, the Si film 301 is formed also on the susceptor 207.

Figure 2C:
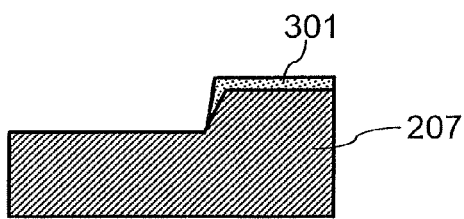
FIG. 2c shows a substrate after removal of a susceptor.

After the Si film 301 is formed, as shown in FIG. 2c, the substrate 106 is removed from the susceptor 207. As shown in FIG. 2c, no Si film is present on the surface of the susceptor 207 where the substrate 106 has been placed. That is, the steps shown in FIGS. 2a to 2c are steps for forming a Si film on the surface of the susceptor 207 that will not be covered with a substrate during the formation of a SiC film.

Then, the step of forming a SiC film 302 is performed. This step is the same as a SiC epitaxial wafer manufacturing step usually performed. The thickness of the SiC film 302 is usually about 50 to 100 μm.

Figure 2D:
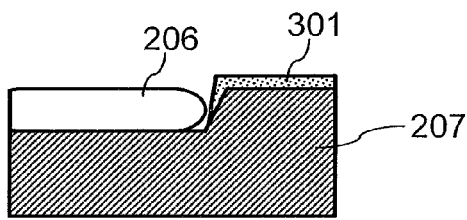
FIG. 2d shows a substrate placed on a susceptor.

First, after the substrate 106 is taken out of the chamber 201, the substrate 206 is transported into the chamber 201. Then, as shown in FIG. 2d, the substrate 206 is placed on the susceptor 207.

Then, the substrate 206 placed on the susceptor 207 is rotated at about 50 rpm by rotating the susceptor 207.

The heater 208 is operated by supplying current to heat the substrate 206 by the heater 208. The substrate 206 is gradually heated until the temperature of the substrate 206 reaches a predetermined value between 1500 to 1700° C. at which a SiC film is formed (e.g., 1650° C.). At this time, cooling water is allowed to flow through the flow channels 203a and 203b provided in and near the wall of the chamber 201. This makes it possible to prevent an excessive increase in the temperature of the chamber 201.

After the temperature of the substrate 206 reaches 1650° C., the temperature of the substrate 206 is carefully adjusted by the heater 208 to be around 1650° C. At this time, the temperature of the substrate 206 can be measured using a radiation thermometer.

After it is confirmed that the temperature of the substrate 206 has reached the predetermined value by measurement using a radiation thermometer, the number of revolutions of the substrate 206 is gradually increased. For example, the number of revolutions of the substrate 206 may be increased to about 900 rpm.

The process gas 225 containing a reaction gas is supplied from the supply portion 204 through the shower plate 220 so as to flow downward toward the surface of the substrate 206. At this time, the process gas 225 is straightened when passing through the shower plate 220 as a straightening vane, and therefore flows downward substantially vertically toward the substrate 206 located under the shower plate 220 so that a so-called vertical flow is formed.

As the process gas 225, a mixture gas obtained by mixing, for example, a silicon (Si) source gas such as silane ($SiH_4$) or dichlorosilane ($SiH_2Cl_2$), a carbon (C) source gas such as propane ($C_3H_3$) or acetylene ($C_2H_2$), and hydrogen ($H_2$) gas as a carrier gas is used.

The process gas 225 that has reached the surface of the substrate 206 causes a pyrolytic reaction or a hydrogen reduction reaction so that a SiC film is formed on the substrate 206. The process gas 225 other than that used for a vapor-phase growth reaction is turned into a denatured production gas and discharged through the discharge portion 205 provided in the lower part of the chamber 201.

After the SiC film 302 having a predetermined thickness is formed on the substrate 206, the supply of the process gas 225 is stopped. Then, the substrate 206 is taken out of the chamber 201 after it is confirmed that the substrate 206 has been cooled to a predetermined temperature.

Figure 2E:
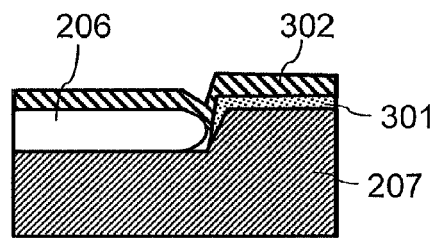
FIG. 2e shows the state of the substrate after forming the SiC film.

FIG. 2e shows the state after forming the SiC film 302 on the substrate 206. Here, the SiC film 302 is formed also on the surface of the susceptor 207, to be precise, on the Si film 301 formed on the susceptor 207.

Figure 2F:
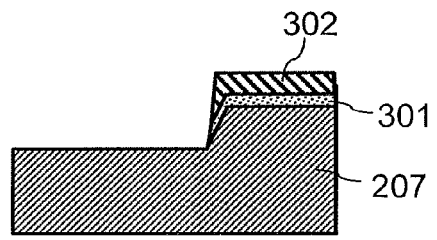
FIG. 2f shows the state after removing the substrate from the surface of the susceptor.

FIG. 2f shows the state after removing the substrate 206 from the surface of the susceptor 207. As can be seen from FIG. 2f, the SiC Film 302 is not present in an area where the substrate 206 has been placed.

Then, the SiC film 302 deposited on the surface of the susceptor 207 is removed together with the Si film 301.

First, the susceptor 207 is heated by the heater 208 while being rotated. The number of revolutions of the susceptor 207 can be set to, for example, 400 to 1000 rpm. The susceptor 207 can be heated to a temperature of, for example, 1000 to 1200° C. It is to be noted that the control of the number of revolutions and temperature of the susceptor 207 during etching does not need to be as strict as that during film formation.

Figure 2G:
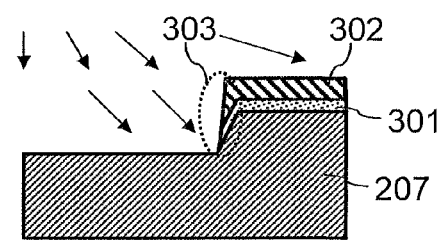
FIG. 2g shows an etching gas flowing downward toward the susceptor.

Then, an etching gas is introduced from the supply channel 204, and as shown in FIG. 2g, the etching gas is allowed to flow downward toward the susceptor 207. As the etching gas, for example, HCl gas diluted to 50% with $H_2$ gas can be used.

Here, part of the Si film 301 is exposed on the surface of a stepped portion 303 provided on the susceptor 207. This is a result of the difficulty in forming the SiC film 302 so that the Si film 301 is completely covered with the SiC film 302 in the stepped portion 303. It is natural that the Si film 301 not covered with the SiC film 302 should be present in view of the fact that the substrate 106 or the substrate 206 is placed close to the stepped portion 303 during formation of the Si film 301 or the SiC film 302 and there is a possibility that the substrate 206 is not placed at exactly the same position as the substrate 106.

When HCl gas is introduced in a state where the susceptor 207 is heated, the Si film 301 exposed on the surface of the stepped portion 303 reacts with the HCl gas so that a compound $Si_xCl_y$ is formed, since the susceptor 207 is rotated, the compound $Si_xCl_y$ is carried by the flow of the etching gas together with the SiC film 302, and is therefore removed from the peripheral portion of the susceptor 207 and discharged through the discharge portion 205. That is, according to this method, both the Si film 301 and the SiC film 302 can be removed. The SiC film 302 is not etched by HCl gas, but the Si film 301 located under the SiC film 302 is etched by HCl gas, which makes it possible to remove the SiC film 302 from the surface of the susceptor 207. It is to be noted that a SiGe film or another silicon compound film may be formed instead of the Si film 301 as long as it can be etched by HCl gas.

Figure 2H:
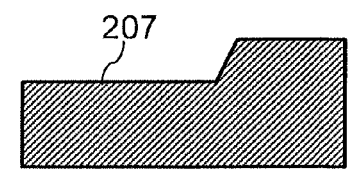
FIG. 2h is a schematic diagram of the surface of the susceptor after the etching process.

Time can also be used to determine the end of the etching process using $ClF_3$ gas. FIG. 2h is a schematic diagram of the surface of the susceptor 207 after the etching. As shown in FIG. 2h, according to this embodiment, the SiC film 302 deposited on the surface of the susceptor 207 can be removed by etching using HCl gas.

The substrate 106 used in this embodiment preferably is the same size as the substrate 206. However, the effect of the present invention can be obtained even when the size of the substrate 106 is smaller than that of the substrate 206. In this case, in FIG. 2d, the Si film 301 is partially located under the substrate 206. Therefore, after the completion of the formation of the SiC film 302 on the substrate 206, that is, in FIG. 2f, part of the Si film 301 is not covered with the SiC film 302. However, also in this case, as shown in FIG. 2g, the Si film 301 is removed by etching using HCl gas so that the susceptor 207 is brought into the state shown in FIG. 2h.

On the other hand, when a substrate 106 larger in size than the substrate 206 is used, the following phenomenon occurs. In FIG. 2d, the Si film 301 is not present on part of the surface of the susceptor 207 not covered with the substrate 206. This means that the SiC film 302 will be directly formed on the part of the surface of the susceptor 207 during formation of the SiC film 302 on the substrate 206. The SiC film 302 directly formed on the surface of the susceptor 207 is not removed by etching using HCl gas shown in FIG. 2g. Therefore, when a substrate 106 larger in size than the substrate 206 is used, it is difficult to obtain the same effect as when the substrate 106 has the same size as the substrate 206 or a substrate 106 smaller in size than the substrate 206 is used. However, the SiC film 302 directly formed on the surface of the susceptor 207 can be removed by etching using $ClF_3$ gas in the following manner.

According to this embodiment, a small amount of $ClF_3$ gas is preferably introduced into the chamber 201 after etching using HCl gas to prevent part of the SiC film 302 to be removed together with the Si film 301 from remaining in the chamber 201. The etching using $ClF_3$ gas also makes it possible to, when a substrate 106 larger in size than the substrate 206 is used, remove the SiC film 302 that is formed on the surface of the susceptor 207 and cannot be removed by etching using HCl gas. However, introduction of $ClF_3$ gas needs to be performed at a low temperature in a short period of time to prevent etching of SiC film constituting the susceptor 207 and the inner wall of the chamber 201. For example, etching using $ClF_3$ gas can be performed using residual heat after the heater 208 is turned off. When etching using HCl gas is performed for 30 minutes, etching using $ClF_3$ gas may be performed for 3 minutes.

Time can also be used to determine the end of the etching process using $ClF_3$ gas. As described above, it is considered that the SiC film deposited on the surface of the susceptor 207 is a nondense and polycrystalline film different from a dense and polycrystalline SiC film constituting the susceptor 207 (SiC film coating the surface of graphite). Therefore, it is conceivable that the etching rate of the nondense and polycrystalline SiC film is sufficiently higher than that of the dense and polycrystalline SiC film. However, these films have the same composition, and therefore etching using 100% $ClF_3$ gas is not sufficient.

For this reason, $ClF_3$ gas diluted to a concentration of 10 to 20% with nitrogen gas is preferably used as an etching gas for etching processing. Etching of a single crystal SiC film is usually performed using 100% $ClF_3$ gas, but in this case, a clear difference can be made between the etching rate of the dense and polycrystalline SiC film and the etching rate of the nondense and polycrystalline SiC film by using diluted $ClF_3$ gas.

When supplied into the chamber 201, $ClF_3$ gas reacts with SiC according to the following reaction formula (I), (as seen in Non-patent document: (Y. Miura, H. Habuka, Y. Katsumi, S. Oda, Y. Fukai, K. Fukae, T. Kato, H. Okumura, K. Arai, Japanese Journal of Applied Physics. Vol. 46, No. 12, 2007, p.p. 7875-7879)).

$$3SiC+8ClF_3 \rightarrow 3SiF_4+3CF_4+4Cl_2 \qquad \text{formula (1)}$$

The SiC film remaining in the chamber 201 is removed by etching based on the reaction.

As described above, the susceptor treatment method and semiconductor manufacturing apparatus treatment method according to this embodiment make it possible to remove a SiC film deposited on a susceptor without using $ClF_3$ gas.

The features and advantages of the present invention may be summarized as follows:

According to the present invention, it is possible to provide a susceptor treatment method and a semiconductor manufacturing apparatus treatment method, which make it possible to remove a film deposited on a susceptor during SiC epitaxial growth.

Obviously many modifications and variations of the present invention are possible in the light of the above teachings. It is therefore to be understood that within the scope of the appended claims the invention may be practiced otherwise than as specifically described.

What is claimed is:

1. A susceptor treatment method comprising the steps of:
   placing a first substrate on a susceptor and forming a Si film on the first substrate by epitaxial growth;
   placing a second substrate on the susceptor in place of the first substrate and forming a SiC film on the second substrate by epitaxial growth; and
   after removal of the second substrate, allowing HCl gas to flow downward from above the susceptor while the susceptor is heated thereby removing the Si film and the SiC film.

2. The susceptor treatment method according to claim 1, wherein, a Si film is formed on the first substrate with a thickness in the range of 20 to 50 μm.

3. The susceptor treatment method according to claim 1, wherein the step of removing the Si film and the SiC film using HCl gas is performed while the susceptor is rotated.

4. The susceptor treatment method according to claim 3, wherein the step of removing the Si film and the SiC film using HCl gas is performed while the susceptor is rotated at a speed between 400 and 1000 rpm.

5. The susceptor treatment method according to claim 1, wherein the step of removing the Si film and the SiC film using HCl gas is performed while the susceptor is heated to a temperature between 1000 and 1200° C.

6. The susceptor treatment method according to claim 1, wherein, time is used to determine the end of the HCl gas use.

7. The susceptor treatment method according to claim 1, further comprising, after the step of removing the Si film and the SiC film using HCl gas, a step for allowing $ClF_3$ gas to flow downward from above the susceptor.

8. The susceptor treatment method according to claim 7, wherein, $ClF_3$ gas is diluted to a concentration of 10 to 20% with nitrogen gas.

9. The susceptor treatment method according to claim 7, wherein, time is used to determine the end of the $ClF_3$ gas use.

10. A method for treating a semiconductor manufacturing apparatus comprising a susceptor on which a wafer is to be placed and a film-forming chamber in which the susceptor is placed to form an epitaxial film on the wafer, the method comprising:
    placing a dummy wafer on the susceptor in the film-forming chamber and forming a Si film on the dummy wafer by epitaxial growth;
    removing the dummy wafer from the susceptor; and
    then placing the wafer on the susceptor in place of the dummy wafer and forming a SiC film on the wafer by epitaxial growth;
    removing the wafer from the susceptor; and
    allowing HCl gas to flow downward from above the susceptor while the susceptor is heated, thereby removing the Si film and the SiC film from the susceptor.

11. The method for treating a semiconductor manufacturing apparatus according to claim 10, wherein, a Si film is formed on the dummy wafer with a thickness in the range of 20 to 50 μl.

12. The method for treating a semiconductor manufacturing apparatus according to claim 10, wherein the step of removing the Si film and the SiC film using HCl gas is performed while the susceptor is rotated.

13. The method for treating a semiconductor manufacturing apparatus according to claim 12, wherein the step of removing the Si film and the SiC film using HCl gas is performed while the susceptor is rotated at a speed between 400 and 1000 rpm.

14. The method for treating a semiconductor manufacturing apparatus according to claim 10, wherein the step of removing the Si film and the SiC film using HCl gas is performed while the susceptor is heated to a temperature between 1000 and 1200° C.

15. The method for treating a semiconductor manufacturing apparatus according to claim 10, wherein, time is used to determine the end of the HCl gas use.

16. The method for treating a semiconductor manufacturing apparatus according to claim 10, wherein after the Si film and the SiC film are removed by the HCl gas, $ClF_3$ gas is allowed to flow downward from above the susceptor.

17. The method for treating a semiconductor manufacturing apparatus according to claim 16, wherein, $ClF_3$ gas is diluted to a concentration of 10 to 20% with nitrogen gas.

18. The method for treating a semiconductor manufacturing apparatus according to claim 16, wherein, time is used to determine the end of the $ClF_3$ gas use.

* * * * *

UNITED STATES PATENT AND TRADEMARK OFFICE
CERTIFICATE OF CORRECTION

PATENT NO.           : 8,334,214 B2
APPLICATION NO.      : 13/170867
DATED                : December 18, 2012
INVENTOR(S)          : Kunihiko Suzuki et al.

It is certified that error appears in the above-identified patent and that said Letters Patent is hereby corrected as shown below:

In claim 11, column 10, line 18, change "µl" to --µm--.

Signed and Sealed this
Twelfth Day of March, 2013

Teresa Stanek Rea
*Acting Director of the United States Patent and Trademark Office*